United States Patent [19]
Hewitt et al.

[11] Patent Number: 5,796,851
[45] Date of Patent: Aug. 18, 1998

[54] DIGITAL METHOD TO ELIMINATE POWER-ON POPS AND CLICKS

[75] Inventors: Larry Hewitt; Carlin Dru Cabler, both of Austin, Tex.

[73] Assignee: Advanced Micro Devices, Inc., Sunnyvale, Calif.

[21] Appl. No.: 760,760

[22] Filed: Dec. 5, 1996

[51] Int. Cl.$^6$ .................................................. H04B 15/00
[52] U.S. Cl. .................................. 381/94.5; 351/120
[58] Field of Search ........................ 381/94.5, 94.4, 381/120; 364/723; 84/621, 627, 663, 665

[56] References Cited

U.S. PATENT DOCUMENTS

| | | | |
|---|---|---|---|
| 4,416,178 | 11/1983 | Ishida . | |
| 4,418,598 | 12/1983 | Klynas . | |
| 4,441,086 | 4/1984 | Karlow et al. | 330/297 |
| 4,859,955 | 8/1989 | Trethewey | 330/279 |
| 4,947,440 | 8/1990 | Bateman et al. | 381/107 |
| 5,151,942 | 9/1992 | Sasaki | 381/94.5 |
| 5,199,079 | 3/1993 | Anderson et al. | 381/94.5 |

*Primary Examiner*—Forester W. Isen
*Attorney, Agent, or Firm*—Conley, Rose & Tayon; Dan J. Krueger; Jeffrey C. Hood

[57] ABSTRACT

A personal computer audio system is presented with a mechanism for digitally regulating the rate of voltage change of an audio output signal In one embodiment, the audio output signal from an integrated circuit is provided by means of a two-state audio amplifier. The first state of the amplifier is a high impedance state which exists prior to power-on and is maintained until an enable signal is asserted. When the enable signal is asserted, the amplifier drives the audio output signal line. Prior to the transition from the first to second states, a D/A converter is used to provide a ramp signal from the minimum voltage to the nominal operating voltage. The state transition is then initiated during the initial portion of the ramp signal.

6 Claims, 3 Drawing Sheets

DIGITAL METHOD TO ELIMINATE POWER-ON POPS AND CLICKS

BACKGROUND OF THE INVENTION

1. Field of the Invention

The present invention concerns the area of audio systems for personal computers. More particularly, a method is provided for eliminating clicks and pops which may occur during startup of audio operation.

2. Description of the Relevant Art

Conventional digital audio circuits comprise integrated circuits (IC) such as digital signal processors (DSP), digital-to-analog converters (DAC), audio signal mixers and audio amplifiers. These circuits are coupled to sound-generating sources such as speakers and headphones. The sudden voltage changes that occur within the integrated circuitry when power is applied typically will produce a "glitch" in the sound produced by the sound-generating sources. These sound glitches are perceived as noisy and greatly undesired clicks or pops by a listener. Any of the ICs which drive the signals that eventually reach the sound generating source are potential origins of the glitch. The glitch results from the fact that the output of the IC is near 0.0 volts before power is applied, but rises substantially instantaneously to a different nominal voltage after power is applied.

Various methods are currently used to reduce and/or eliminate pops and clicks which occur in an audio system. For example, a relay is sometimes used, which is somewhat expensive and bulky. Therefore, an improved system and method for eliminating undesirable glitches or pops and clicks is desired.

SUMMARY OF THE INVENTION

The present invention comprises a personal computer (PC) audio system with an improved system and method for reducing or eliminating pops and clicks in the audio system. The present invention includes a mechanism for digitally regulating the rate of voltage change of an audio output signal after power is applied to reduce or eliminate pops and clicks.

In one embodiment, the present invention contemplates a PC audio system which includes an audio amplifier coupled to receive an input audio signal and an enable signal. The audio amplifier is preferably a two-state audio amplifier. The first state of the amplifier is a high impedance state which exists prior to power-on and is maintained until the enable signal is asserted. When the enable signal is asserted, the amplifier serves to accept and amplify an input audio signal and thereafter drive the audio output signal line. The audio amplifier is thus configured to provide to an output line (1) a high impedance path to ground when the enable signal is not asserted, and (2) an output audio signal by amplification of the input audio signal when the enable signal is asserted. The audio amplifier defaults to the high impedance state at power up and is disabled while voltage is initially applied. Hence, an output amplifier or speaker driven by the output of the audio amplifier receives only a high impedance connection to ground until the enable signal is asserted.

After power up and prior to transition of the amplifier from the first to second states, a software programmable driver provides a special audio wave file through THE DAC that begins at the minimum negative voltage value and slowly ramps to zero. In other words, the software driver provides a ramp signal from the minimum voltage to the nominal operating voltage. The state transition is then initiated during the initial portion of the ramp signal.

The PC audio system further includes an analog sound-reproduction element capacitively coupled to the output line of the audio amplifier. Also present is a digital-to-analog converter configured to receive a digital sequence and coupled to provide the input audio signal to the audio amplifier. Additionally, a control element is configured to provide as a portion of the digital sequence a ramp sequence which progresses smoothly across a range from minimum voltage to nominal operating voltage, and configured to initiate assertion of said enable signal while the ramp sequence is at minimum voltage.

BRIEF DESCRIPTION OF THE DRAWINGS

Other objects and advantages of the invention will become apparent upon reading the following detailed description and upon reference to the accompanying drawings in which.

Figure 1:
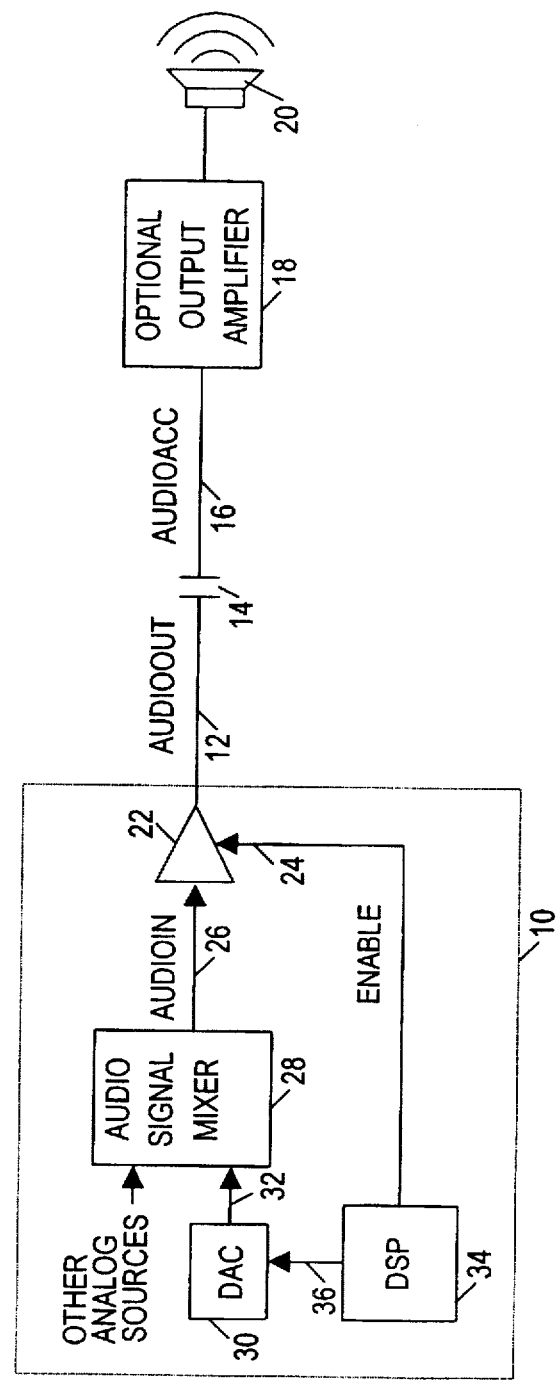
FIG. 1 is a block diagram schematic illustrating operation of a PC audio system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

In accordance with the above disclosure, FIG. 1 illustrates operation of a PC audio system. Integrated circuit (IC) 10 includes an output 12 which provides an audio output signal. The audio output signal is provided to a capacitor 14. Capacitor 14 passes only the alternating current (AC) components of audio output signal 12 and blocks the direct current component. Capacitor 14 produces an AC-coupled audio signal 16. The AC-coupled audio signal may be amplified by use of an optional output amplifier 18 prior to driving an audio speaker 20. Herein, speaker is a term defined to be a transducer for converting electrical signals to audio signals, and is intended to include configurations with more than one such transducer, e.g. headphones.

IC 10 comprises a two-state audio amplifier 22 coupled to provide audio output signal 12. Amplifier 22 is operable in a first state when the amplifier 22 provides a high impedance path to ground. Amplifier 22 functions in the first state prior to power-up, and maintains this state until an enable signal 24 is asserted. Upon assertion of enable signal 24, amplifier 22 begins operating in a second state. In the second state, amplifier 22 drives the audio output signal line with an amplified version of an audio input signal 26.

IC 10 may also comprise an audio signal mixer 28 which additively combines a plurality of analog signals to form audio input signal 26. One of the sources of analog signals is a digital-to-analog converter (DAC) 30, which provides audio signal 32. DAC 30 is coupled to an output of a DSP 34, and operates to convert a digital sequence 36 from DSP 34 to audio signal 32.

DSP 34 operates under software control to generate the digital sequence 36. For implementation reasons which are well understood by persons of average skill in the area, DSP 34 generates a default digital sequence which causes DAC 30 to provide audio signal 32 with a nominal operating value halfway between the ground and the maximum voltage. Thus when power is first applied to IC 10, audio signal 32 experiences a fast transition from ground to the nominal operating voltage. In prior art systems, this transition would result in a "pop" at the speaker. With the presence of enable signal 24, this pop may still result upon assertion of enable signal 24 as audio output signal 12 makes a fast transition from ground to the nominal operating voltage.

Figure 2:
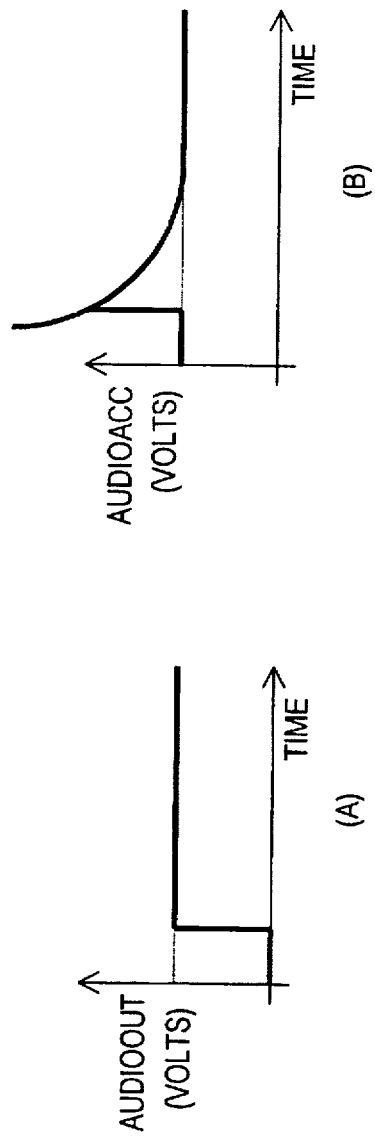
FIG. 2 is a graphical presentation of signals present at startup in conventional PC audio systems.

Turning now to FIG. 2. FIG. 2a is a graph illustrating a fast transition of audio output signal 12 from ground to nominal operating voltage. FIG. 2b is a graph illustrating the resulting AC-coupled audio signal 16. The presence of the voltage spike shown in the signal which drives speaker 20 produces a noisy click or pop from speaker 20. As discussed above, this noisy click or pop is undesirable.

Figure 4:
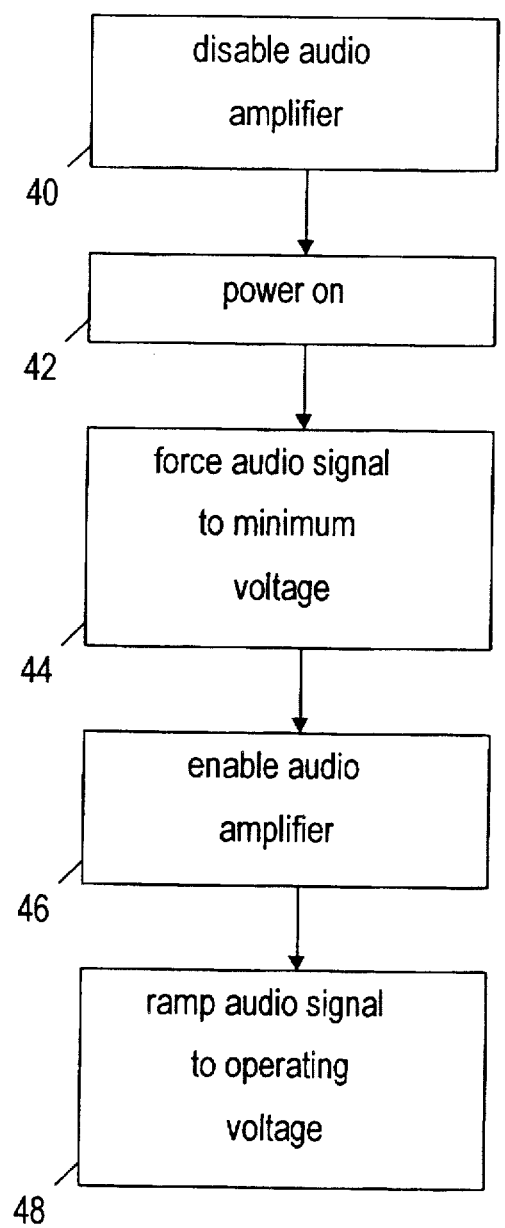
FIG. 4 is a flowchart diagram illustrating a method for reducing or eliminating power-in pops and clicks.

Turning now to FIG. 4 with reference to FIG. 1, the operation of the present invention is described. A gradual transition of audio output signal 12 may be achieved in the following manner. Before power is applied to the system, amplifier 22 is disabled 40 and exists in a high-impedance state. Amplifier 22 remains in the disabled state when power is applied 42. DSP 34 under software control then performs the following steps: Digital sequence 36 is set 44 so as to force audio signal 32 to the minimum voltage prior to asserting enable signal 24. Next, the enable signal is asserted 46. Finally, a digital sequence 36 is provided 48 which slowly raises the voltage of audio signal 32 until nominal operating voltage is reached.

Figure 3:
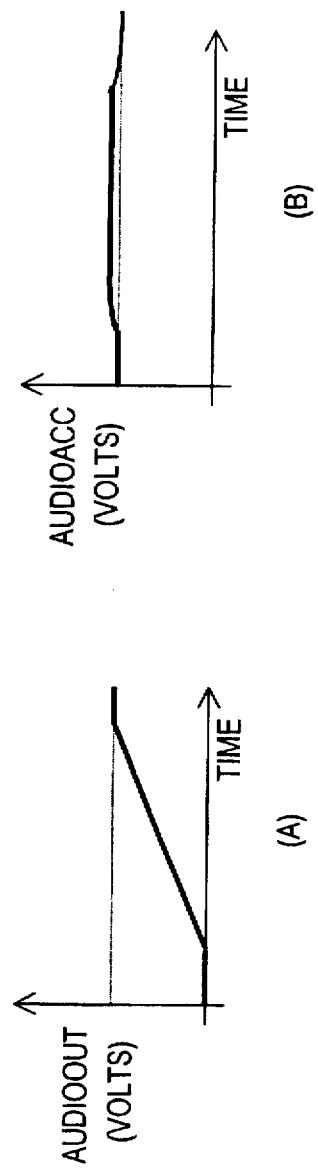
FIG. 3 is a graphical presentation of signals present at startup in a preferred embodiment of PC audio systems.

Turning now to FIG. 3 (which may be compared to FIG. 2), FIG. 3a provides a graph illustrating a slow, smooth transition of audio output signal 12 from ground to nominal

What is claimed is:

1. An apparatus for click-free initiation of audio operation which comprises:

an audio amplifier coupled to receive an input audio signal and an enable signal, and configured to provide to an output line (1) an output audio signal by amplification of the input audio signal when said enable signal is asserted, and (2) a high impedance path to ground when said enable signal is not asserted;

a digital-to-analog converter configured to receive a digital sequence and coupled to provide said input audio signal to said audio amplifier; and a control element configured to provide as a portion of said digital sequence a ramp sequence which progresses smoothly across a range from minimum voltage to nominal operating voltage, and configured to initiate assertion of said enable signal while the ramp sequence is at minimum voltage.

2. The apparatus for click-free initiation of audio operation as recited in claim 1, further comprising an audio signal mixer interposed between said digital-to-analog converter and said audio amplifier, wherein said audio signal mixer is configured to accept a plurality of analog audio signals and thereafter additively combine said plurality of audio signals to form said input audio signal.

3. The apparatus for click-free initiation of audio operation as recited in claim 1, wherein said control element is a digital-signal processor.

4. An audio system having a click-free power-up sequence, wherein the audio system comprises:

a processor configured to produce a sequence of digital audio samples;

a digital-to-analog converter coupled to receive the digital audio samples from the processor, wherein the digital-to-analog converter is configured to convert the sequence of digital audio samples to an analog audio signal, wherein said analog audio signal is provided with a nominal operating DC voltage;

an audio amplifier coupled to receive the analog audio signal and configured to amplify the audio signal to produce an audio output signal on an output signal line when an enable signal is asserted, wherein the audio amplifier is further configured to couple the output signal line to ground when the enable signal is de-asserted;

wherein during the power-up sequence the processor is configured to produce as a part of the sequence of digital audio samples a series of samples forming a ramp that smoothly traverses a range from a minimum sample value to a sample value which corresponds to the nominal operating DC voltage, and wherein the processor asserts the enable signal when the series of samples is at the minimum sample value.

5. The audio system of claim 4, further comprising a audio signal mixer which couples the analog audio signal from the digital-to-analog converter to the audio amplifier, wherein the audio signal mixer is configured to receive additional audio signals and to additively combine the additional audio signals with the analog audio signal for amplification by the audio amplifier.

6. The audio system of claim 4, wherein the audio amplifier is configured to couple the output signal line to ground via a high impedance path when the enable signal is de-asserted.

* * * * *